United States Patent [19]

Goedicke et al.

[11] Patent Number: 5,693,417
[45] Date of Patent: Dec. 2, 1997

[54] VACUUM-COATED COMPOUND BODY AND PROCESS FOR ITS PRODUCTION

[75] Inventors: Klaus Goedicke; Gunter Hotzsch; Fred Fietzke, all of Dresden; Olaf Zywitzki, Freiberg; Siegfried Schiller, Dresden; Jonathan Reschke, Dresden; Wolfgang Hempel, Dresden, all of Germany

[73] Assignee: Fraunhofer-Gesellschaft zur Forderung der angewandten Forschung e.V., Munich, Germany

[21] Appl. No.: 445,523

[22] Filed: May 22, 1995

[51] Int. Cl.$^6$ .................................................. C23C 8/00
[52] U.S. Cl. .......................... 428/336; 428/216; 428/469; 428/472; 428/698; 428/701; 428/702; 204/192.1; 204/192.15; 204/192.22
[58] Field of Search .......................... 428/216, 701, 428/698, 699, 336, 472, 469, 702; 204/192.1, 192.15, 192.22

[56] References Cited

U.S. PATENT DOCUMENTS

| Re. 32,110 | 4/1986 | Hale | 428/336 |
|---|---|---|---|
| 3,836,392 | 9/1974 | Lux et al. | |
| 3,914,473 | 10/1975 | Hale | |
| 4,180,400 | 12/1979 | Smith et al. | 428/469 |
| 4,357,382 | 11/1982 | Lambert et al. | 428/699 |
| 4,399,168 | 8/1983 | Kullander et al. | 428/701 |
| 4,463,062 | 7/1984 | Hale | |
| 4,608,098 | 8/1986 | Hale | 148/6.3 |
| 4,619,866 | 10/1986 | Smith et al. | 428/701 |
| 4,984,940 | 1/1991 | Bryant et al. | 428/698 |
| 5,071,696 | 12/1991 | Chatfield et al. | |
| 5,137,774 | 8/1992 | Ruppi | |
| 5,256,266 | 10/1993 | Blanchette et al. | |
| 5,350,607 | 9/1994 | Tyson et al. | |
| 5,357,389 | 10/1994 | Blanchette et al. | |
| 5,487,625 | 1/1996 | Ljungberg et al. | 428/699 |
| 5,492,606 | 2/1996 | Stauder et al. | |
| 5,543,019 | 8/1996 | Lee et al. | |

FOREIGN PATENT DOCUMENTS

| 0539694 | 5/1993 | European Pat. Off. |
|---|---|---|
| 0605299 | 7/1994 | European Pat. Off. |
| 2233700 | 1/1973 | Germany |
| 2253745 | 1/1982 | Germany |
| 252205 | 9/1986 | Germany |
| 3802852 | 8/1989 | Germany |
| 4110005 | 10/1992 | Germany |
| 4110006 | 10/1992 | Germany |
| 4223505 | 11/1993 | Germany |
| 1464022 | 2/1977 | United Kingdom |
| 9425637 | 11/1994 | WIPO |

OTHER PUBLICATIONS

European Search Report of EPO 96 10 6600.
"Characterization of α-Al$_2$O$_3$, k-Al$_2$O$_3$ and α-k Multioxide Coating on Cemented Carbides", *Thin Solid Films*, 193/194, pp. 536–546 (1990).

(List continued on next page.)

*Primary Examiner*—Archene Turner
*Attorney, Agent, or Firm*—Greenblum & Bernstein P.L.C.

[57] ABSTRACT

Vacuum coated compound body and a process for its production. Such compound bodies, when coated in a known manner, have a carrier of a metal or of an alloy, a layer that is thermally, mechanically and chemically unstable, with their surface showing cracks and being partially porous. These shortcomings are overcome via an improved eco-friendly vacuum deposition process wherein at least one layer of a material having an outer layer is of Al$_2$O$_3$, is applied to the metal or alloy carrier at a maximum of 700° C., with this layer being completely crystalline and comprised of an αAl$_2$O$_3$ phase and possibly of a γAl$_2$O$_3$ phase with a (440) texture, having a compressive stress of at least 1 Gpa and a hardness of at least 20 Gpa, with the Al$_2$O$_3$ layer being deposited via reactive magnetron sputtering, wherein the magnetrons are pulse powered, the pulse frequency lies between 20 and 100 Khz, and the deposition rate is at least 1 nm/s, with the compound bodies being utilized for cutting treatments, particularly as drills, milling cutters, reamers, broaches or saw blades.

28 Claims, 1 Drawing Sheet

OTHER PUBLICATIONS

"Alumina Deposition by Activated Reactive Evaporation", *Thin Solid Films*, 40, pp. 211–216 (1977).

English translation of: JP–59–40223, published Sep. 28, 1984.

Thornton and Chin, "Structure and Heat Treatment Characteristics of Sputter–Deposited Alumina", *Ceramic Bulletin*, vol. 56, No. 5, 1977, pp. 504–512, cited and described on p. 3, first full paragraph, of the instant application.

Scherer, Latz, and Patz; Proc. 7th Int. Conf. IPAF, Geneva, 1989, pp. 181 et al., entitled "A novel solution for the fast deposition of A1203 by DC reactive magnetron sputering", cited and described on p. 3, penultimate paragraph, of the instant application.

Bunshah, Schramm; entitled "Alumina deposition by activated reactive evaporation", in *Thin Solid Films* 40 (1977), pp. 211–216, cited and described on p. 4, first paragraph, of the instant application.

VACUUM-COATED COMPOUND BODY AND PROCESS FOR ITS PRODUCTION

CROSS REFERENCE TO RELATED APPLICATIONS

This application is the cognate of German Application No. DE 195 18 781.4, filed May 22, 1995, the disclosure of which is incorporated herein by reference in its entirety.

BACKGROUND OF THE INVENTION

1. Field of the Invention

This invention pertains to a compound body, whose carrier is preferably comprised of metal, upon which one or more surface layers are applied, of which at least one layer is deposited via vacuum deposition and comprised of aluminum oxide ($Al_2O_3$). Such compound bodies are used, for example, as tools for cutting operations, forming or shaping tools, machine parts or slide/guide ways.

2. Discussion of the Background of the Invention and Material Information

There are known compound bodies that include an $Al_2O_3$ layer, that is deposited via chemical phase deposition (CVD), at temperatures above 1000° C., onto a carrier of sintered material. Such layers are crystalline and include, in addition to the thermodynamically stable α-phase, in general, additional metastable phases, particularly the v-phase (DE 22 33 700; DE 22 53 745). Due to the high temperature to which the carrier is exposed during the layering or coating, the type of the usable carrier is however restricted to sintered materials, oxide ceramics and other high temperature materials. Particularly, all customary steels and nonferrous materials are excluded or the carrier experiences an unacceptable worsening of its application properties. Of significance therefore are only those compound bodies whose carriers are comprised of sintered materials, and which are utilized in cutting tools, for example as cemented carbide inserts. During their use as cutting tools, such compound bodies succumb to high temperatures. Such high temperatures are accompanied with phase changes, particularly the v-phase. The layers have a rough surface and a relatively high coefficient of friction. Due to a volume contraction during the phase change, a distinct fissure or crack formation and a delamination between the layer and the carrier body results. Therefrom, there results the disadvantage that drastically limits the use of the compound bodies with reference to service life. In order to limit the delamination in cutting tools, the cutting edges of the carrier must be rounded off. Thus, there result substantial limits of the cutting performance and the surface quality of the machined workpieces.

The use of carriers of tool steel is generally impossible, since these steels lose their advantageous application properties above 550° C.

In addition, there are known compound bodies that have an $Al_2O_3$ layer deposited via plasma-enhanced CVD processes (DE 41 10005; DE 41 10 006). Such layers include process-dependent impurities, that emanate from an incomplete chemical reaction. These layers, for example, include a chlorine content of 0.5 to 3.5%. The $Al_2O_3$ layers, on these compound bodies, include, in addition to the crystalline α-$Al_2O_3$, generally a high portion of amorphous aluminum oxides. As a result thereof, there is the disadvantage that as well as the impurities in the $Al_2O_3$, the amorphous phase causes an insufficient chemical, mechanical and thermal stability of the layer on the compound body. Also known are fine grained layers of solely α-$Al_2O_3$ layers on compound bodies. Therein, a dimensioning rule is indicated as being derived for the fine grain structure from the full width at half maximum of the interference lines of the X-ray diffraction analysis (XRD) of the microstructure of the layers. As the production process, there is described a plasma-CVD-process, having the previously noted disadvantages (DE 41 10 005; DE 41 10 006). It can be assumed that the line width in the XRD analysis arises mainly from the lattice distortions due to the impurities of the layers, and not, as indicated, only from the fine-grained microstructure of the $Al_2O_3$ layers. Generally, all of the CVD processes require the use of toxic substances and are therefore environmentally damaging.

It is furthermore known to deposit $Al_2O_3$ layers on carrier bodies via radio frequency diodes or magnetron sputtering (Thornton and Chin, Ceramic Bulletin, 56 [1977] page 504). It is also described therein that crystalline α-$Al_2O_3$ layers can also be produced with this process but only when the compound body is exposed to a temperature of at least 1000° C. during the coating. Otherwise, a supplemental heat treatment at 1000° to 1250° C. is required. The disadvantages associated therewith correspond to those of the layers that are deposited via the CVD process.

It has also been described that with $Al_2O_3$ layers, that are produced via sputtering, a relatively high hardness can be achieved, but these layers show an amorphous structure, which is disadvantageous for the stability thereof during use (Scherer, Latz and Patz; Proc. 7th Int. Conf. IPAT, Geneva, 1989, page 181).

Thus, it can be determined that the known vacuum coated compound bodies of sintered materials are always accompanied with shortcomings. In addition, the compound bodies, whose carriers are coated with $Al_2O_3$ via CVD or RF sputtering processes, are expensive to produce since all of the noted processes enable only a low deposition rate of less than 1 nm/s. If compound bodies are, in order to increase the deposition rate, produced with an $Al_2O_3$ layer via reactive vacuum evaporation of the carrier, the resulting $Al_2O_3$ layers are porous and of insufficient hardness, even if the carrier, during the coating, is heated to a temperature of 1000° C. (Bunshah, Schramm; Thin Solid Films 40 [1977] page 211).

It is the task or object of this invention to eliminate the deficiencies of the state of the art. A compound body is to be produced with a thermal, mechanical and chemically stable $Al_2O_3$ layer which has a smooth, crack-free surface. The process for its production should be environmentally compatible, have high process stability and be relatively inexpensive. In particular, a compound body is to be produced whose carrier is comprised of steel.

This task or object, namely a compound body and the process for the production thereof is achieved via the features set forth in the appended claims.

Surprisingly even for those skilled in the art, a compound body was produced with an outer layer of fully or completely crystalline α-$Al_2O_3$, even when the carrier thereof, during the deposition of the layer, does not exceed a maximum of 700° C. It was further determined that a temperature of 550° C. is already sufficient to deposit the noted layer. The $Al_2O_3$ layer typically includes a portion of maximally 1 at % argon. Other impurities cannot be determined via use of the customary analytical methods such as electron probe microanalysis (EMPA). The crystalline size is typically in the range of 0.5 to 2 μm. The properties of the compound body are largely identical if the noted $Al_2O_3$ layer is not totally of the α phase, but consists partially of textured $\delta Al_2O_3$. For these layers a smaller crystallite size has been observed, preferably in the range of 0.05 to 0.1 µm. The formation of the described crystalline phases, particularly the formation of pure $\alpha\ Al_2O_3$ layers, appears to stand in contradiction or opposition to all currently generally accepted thermodynamically-established development postulations for this phase. According thereto, an activation temperature for the formation of $\alpha\ Al_2O_3$ would be required which can be achieved only above a temperature of 1000° C. Obviously, the process in accordance with this invention effects, via a not completely understood additional activation of the components of aluminum and oxygen in plasma, a notable additional contribution to the required activation energy.

Beyond the specific material properties of $\alpha\ Al_2O_3$, the noted assessments of the residual compressive stress and the noted crystalline sizes are responsible for the high hardness of the outer layer of the compound body. A suitable assessment of the residual compressive stress assures that no premature failure of the layer occurs via mechanical fracture formation during abrasive loading of the compound body. On the other hand, the residual compressive stress can be held so low that the adhesion of the $Al_2O_3$ layer on the carrier can be achieved without difficulty. This is of special importance when the carrier is provided with one or several surface layers that are applied as intermediate layers prior to the deposition of the $Al_2O_3$ layer. Suitable interlayers are preferably known hard coatings such as TiN, (Ti.Al)N or TiC.

It can be useful to initially provide the carrier with one or more layers of metals of the group consisting of Ti, Zr, Cr, Al, Nb, Hf, W and/or compounds of these metals in the form of oxides, oxygen nitride, carbides or carbonitrides which then serve as the carrier for the $Al_2O_3$ layer.

If the compound body is developed as a tool for a cutting operation as a drill, milling cutter, reamer or broach, the carrier is comprised of HSS steel. In this mode of application, the $Al_2O_3$ layer has, as an outer layer, a thickness of 1 to 12 µm and preferably has a thickness of 5 µm at the cutting edges.

If the compound body is a forming tool, then its carrier is comprised of tool steel and has an outer $Al_2O_3$ layer of an 1 to 20 µm thickness, which however preferably has a 5 µm thickness. In this embodiment, the compound body has a low coefficient of friction and a high mechanical constancy.

If especially high requirements of hardness, mechanical resistance to wear, transparency and/or low coefficient of friction of the surface are required of the compound body, it is also possible, depending on the field of use, to produce the carrier of aluminum or of an aluminum alloy.

Further fields of use for the compound body of this invention are prefabricated parts for guideways or slide and bearing elements, that are exposed to complex mechanical-abrasive and chemically-corrosive attacks. Therein, again the low coefficient of friction is most advantageous.

The compound bodies of this invention can also withstand the attack of hot and/or chemically active media and therefore find use in power production and in driving techniques.

The process for the production of the compound body, in accordance with this invention, utilizes, in a preferable manner, known basic processes and arrangements for the deposition of electrically insulating connecting layers via magnetron sputtering without the use of an RF discharge. The pulse-shaped excited or energized plasma assures the stability of the sputtering process in spite of the high insulation property of the $Al_2O_3$ layers and prohibits process interruptions via electrical arcing. The suggested principle permits the use of such a high deposition rate and plasma density during the pulse-on time, so that obviously the assumed plasma activation is achieved during the layer formation of the crystalline $\alpha\ Al_2O_3$. An absolutely essential process characteristic is also the pulse-formed alternating impacting of the layers being formed with negative and positive charge carriers of the noted minimum current density.

An advantageous embodiment of the process utilizes devices with unipolar pulsed plasma via the use of aluminum targets sputtered in a reactive gas.

A further, particularly advantageous embodiment utilizes the dual arrangement of two aluminum targets, that are fed via a bipolar (alternating) voltage and in which the Al targets alternately form a cathode and an anode during the magnetron sputtering.

The setting of the oxygen content in the plasma is influenced via geometric limitations of the sputtering device and must therefore be determined experimentally. The required oxygen content is, obviously, due to the increased temperature of the carrier to be coated, substantially higher than the content that must be set in general practice for the deposition of stoichiometric aluminum oxide layers. Connected therewith is a heavier or thicker covering of the Al target with the $Al_2O_3$. The dynamic balance or equilibrium between the formation of $Al_2O_3$ on the target and its resputtering provides a further reason that, molecular fragments are present in the vapor phase which are a prerequisite for the formation of crystalline phases with process-required or procedure driven low temperatures of the carrier.

Both process embodiments are preferably carried out under the influence or effect of an alternating voltage or potential, namely a so-called pulse-bias-potential, at the carrier. The settings, in accordance with this invention, of the values for residual compressive stress and the hardness of the $Al_2O_3$ layers on the carrier is achieved via the adaptation or adjusting of this potential. The limiting of the temperature to 700° C., preferably to 550° C., during the production of the compound body has far-reaching effects on the properties of the compound body. For example, if the carrier is comprised of an HSS steel, due to the limitations of the temperature to a maximum of 550° C., a plurality of the advantageous material and working or machining properties thereof are retained. The direct deposition of the thermodynamically stable $\alpha\text{-}Al_2O_3$-phase, without subsequent phase change is the reason for the complete absence of cracks or fissures in the compound body. Furthermore, even $Al_2O_3$ layers with a larger portion of $\gamma\text{-}Al_2O_3$ show no crack or fissure formation when they are subsequently heated or heated at their use.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF THE PREFERRED EMBODIMENTS AND BEST MODE

Figure 1:
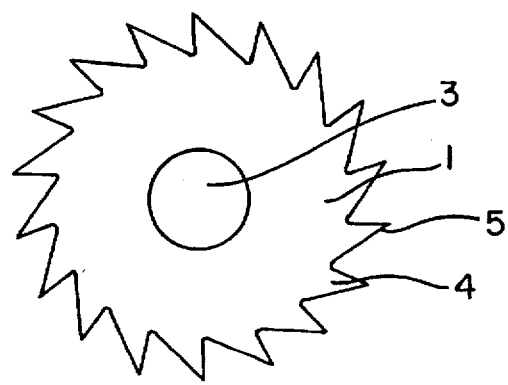
FIG. 1 illustrates an example of an embodiment of the compound body of this invention as a saw blade without a coating.
Figure 2:
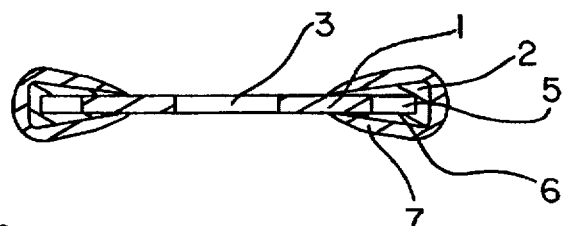
FIG. 2 is a sectional view through a coated compound body of this invention.

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

A carrier 1 of hardened tool steel, in the form of a circular saw blade, is provided, via a known vacuum deposition or layering process, with a layer 2 of $Ti(C,N)_x$. A bore or aperture 3 serves for the fixing or holding of carrier 1 during the further process steps for the production of the compound body as well as for the fixing or holding during its use as a tool. In the region of the saw teeth 4, the layer thickness of layer 2 is about 6±1 μm, as well as on the flanks 5 and also on the surfaces 6 thereof. The layer thickness decreases monotonically in the direction of bore 3. Carrier 1, together with layer 2, forms the foundation or base body, upon which a vacuum deposited $Al_2O_3$ layer 7 is deposited. The $Al_2O_3$ layer 7 has, in the region of flanks 5 and surfaces or areas 6, a thickness of 4±1 μm. Its layer thickness also decreases monotonically in the direction of bore 3. It is a specific characteristic of the compound body, that during the deposition of $Al_2O_3$ layer 7 that it is exposed to a maximum temperature of 500° and that the $Al_2O_3$ layer 7 is completely crystalline in form.

Figure 3:
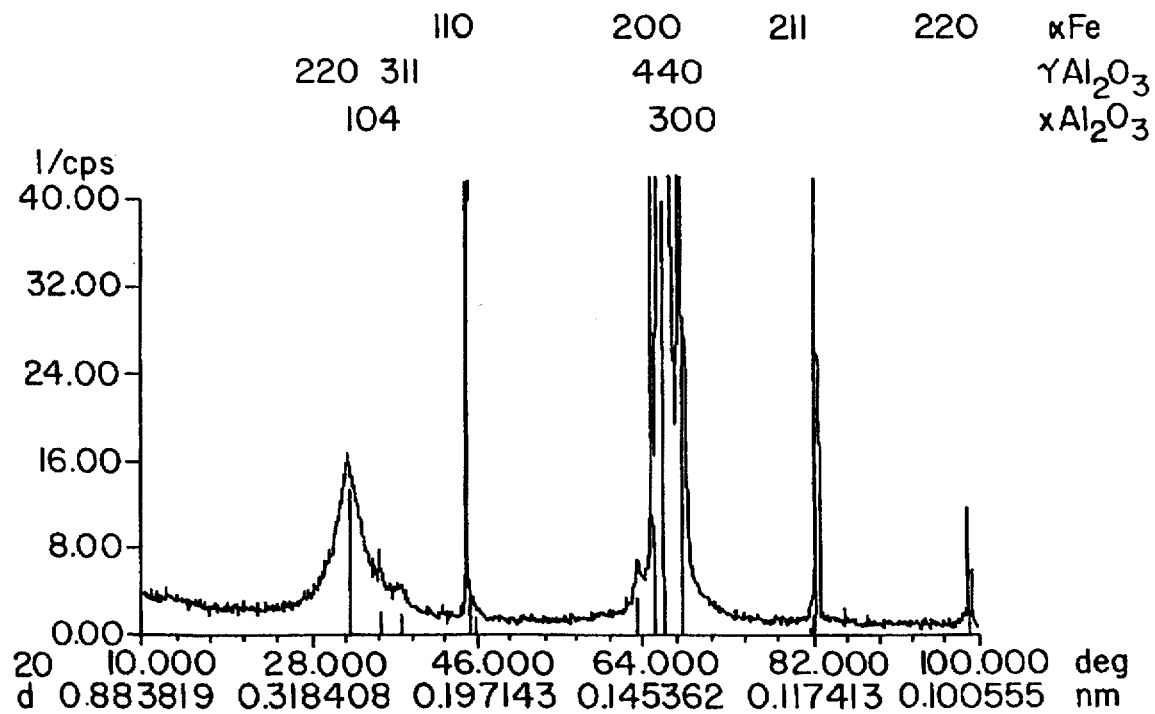
FIG. 3 illustrates the results of an X-ray analysis of the microstructure of the outer surface layer and of a carrier of the ferrous material of a coated compound body of this invention.

FIG. 3 shows the result of the X-ray analysis of the microstructure of $Al_2O_3$ layer 7 and of carrier 1. It was obtained with a Cu α radiation in an X-ray diffractometer. As the abscissa, the spacing of the lattice planes d, the Bragg angle 2Θ respectively, is illustrated. As the ordinate, the intensity of the interferences is shown. The interference lines of the $\alpha$-$Al_2O_3$ phase can be recognized. Metastable phases are not present.

Additional characteristics of the $Al_2O_3$ layer 7 are a minimum residual compressive stress of 1 GPa (in the example, the region of the residual stress was determined as 3.0±0.5 GPa), as well as a high hardness of 21 GPa. This quantity was determined via micro hardness test HV 0.01. An electron probe micro analysis shows an argon content of (0.3±0.1) at % in $Al_2O_3$ layer 7, as well as the absence of further impurities with a concentration above the detection capability of this method. The compound body exhibits excellent adhesion strength of the surface layers, a very low medium roughness in comparison with CVD layers and a coefficient of friction against steel of less than 0.15. As a result of its properties, the compound body is utilized as a high performance cutting tool in the cutting treatment of steels with discontinuous and continuous cutting. In comparison with conventional cutting tools, the compound body distinguishes itself via a greater load carrying capacity and a distinctly increased service life.

The process for the production of the compound body is practiced as follows: The carrier, which is comprised of tool steel and a $Ti(C,N)_x$ layer applied thereupon is, after cleaning, inserted into a vacuum deposition apparatus and pre-processed in a low pressure glow discharge via an etching process. Via an efficient radiation heater in the interior of the vacuum deposition apparatus, a temperature for the carrier is set at 500° C. and held constant. For the deposition of the $Al_2O_3$ layer, the carrier, via the use of the apertures, is retained on rotating rod-shaped retainers, wherein the spacing between each two carriers is 30 mm. Via planet-type movements, it is achieved that all of the areas of the carrier that are to be coated are exposed to the layer forming particle stream. The production of the particle stream is achieved via an arrangement of two magnetron sputtering sources with aluminum targets, that are so connected with an efficient special sinusoidal generator that, at a pulse change or alternating frequency of 50 kHz, both sputtering sources alternate as anode and cathode of the sputtering arrangement. A pressure of 0.1 Pa is set in the vacuum deposition apparatus. The gas is comprised of argon and a portion of about 25 at % oxygen. For the setting of a stable operation of the sputtering arrangement and the exact adjustment of the oxygen portion, the magnetron sputtering sources are initially lit with pure argon gas and thereafter the oxygen content increased to such an extent until a predetermined point is reached in the voltage-current characteristic and predetermined line intensities, controlled via optical spectroscopy, are obtained. With the feeding into the magnetron sputtering sources of electrical energy of 30 Kw, a deposition rate for $Al_2O_3$ is reached that corresponds to a value of 8 nm/s at a fixedly arranged carrier. The $Al_2O_3$ layer being formed is exposed to the intense pulse-plasma in the vicinity of the magnetron sputter sources.

The shortest distance between the moving carriers and the targets of the magnetron sputter sources is 30 mm. The carriers are additionally electrically conductively connected at their aperture with the retainers. The retainers are connected together, in such a manner, during the deposition of the $Al_2O_3$ layer, with a sinusoidal alternating voltage source, at a frequency of 10 kHz, that an effective alternating voltage of ±40 volts, relative to the plasma, and a pulsating current of alternating polarity is set, which corresponds to a charge carrier current of a medium current density of 1.2 mA/cm², with reference to the growing $Al_2O_3$ layer. The coating process for the deposition of the $Al_2O_3$ layer distinguishes itself, in spite of the high electrical insulation property of the $Al_2O_3$ layer, which is deposited on all of the inner walls of the vacuum deposition arrangement, via a high long term stability. Upon reaching the noted thickness of the $Al_2O_3$ layer, the magnetron sputter sources are switched off. After cooling of the coated carriers, they are removed from the vacuum deposition apparatus. The coated compound bodies are ready for their utilization without further thermal follow-up treatments.

While there are shown and described present best mode embodiments of the invention, it is to be distinctly understood that the invention is not limited thereto, but may be otherwise variously embodied and practiced within the scope of the following claims and the reasonably equivalent compounds thereto. Further, the invention illustratively disclosed herein may be practiced in the absence of any element which is not specifically disclosed herein.

What is claimed is:

1. A vacuum coated compound body comprising a carrier of a material selected from the group consisting of a metal and an alloy, and further comprising an outer layer being comprised of $Al_2O_3$ deposited via a vacuum deposition process, wherein the $Al_2O_3$ layer is applied in totally crystalline form at a maximum temperature of 700° C., and is comprised of at least an $\alpha$-$Al_2O_3$-phase, and wherein the $Al_2O_3$ layer has a residual compressive stress of at least 1 GPa and a hardness of at least 20 GPa, and is essentially free of impurities other than argon.

2. The vacuum coated compound body of claim 1, comprising, in alternating sequence ending with the outer $Al_2O_3$ layer, a plurality of $Al_2O_3$ layers and a plurality of layers comprising at least one member selected from the group consisting of Ti, Zr, Cr, Al, Nb, Hf and W metals and metallic compounds.

3. The vacuum coated compound body of claim 1, wherein the $Al_2O_3$ layer further includes a, $\gamma$ $Al_2O_3$-phase having a (440)-texture.

4. The vacuum coated compound body of claim 1, wherein the temperature is approximately 550° C.

5. The vacuum coated compound body of claim 1, wherein the $Al_2O_3$ layer has a thickness in the range of 1 to 20 μm.

6. The vacuum coated compound body of claim 5, comprising, in alternating sequence ending with the outer $Al_2O_3$ layer, a plurality of $Al_2O_3$ layers and a plurality of layers comprising at least one member selected from the group consisting of Ti, Zr, Cr, Al, Nb, Hf and W metals and metallic compounds.

7. The vacuum coated compound body of claim 5, wherein the $Al_2O_3$ layer has a thickness of approximately 3 μm.

8. The vacuum coated compound body of claim 1, further comprising at least one intermediate layer interposed between the $Al_2O_3$ layer and the carrier, wherein the at least one intermediate layer includes at least one layer comprising at least one member selected from the group consisting of Ti, Zr, Cr, Al, Nb, Hf and W metals and metallic compounds.

9. The vacuum coated compound body of claim 8, comprising, in alternating sequence ending with the outer $Al_2O_3$ layer, a plurality of $Al_2O_3$ layers and a plurality of layers comprising at least one member selected from the group consisting of Ti, Zr, Cr, Al, Nb, Hf and W metals and metallic compounds.

10. The vacuum coated compound body of claim 8, wherein the metallic compounds are of the group consisting of oxides, nitrides, oxynitrides, carbides and carbonitrides.

11. The vacuum coated compound body of claim 10, comprising, in alternating sequence ending with the outer $Al_2O_3$ layer, a plurality of $Al_2O_3$ layers and a plurality of layers comprising at least one member selected from the group consisting of Ti, Zr, Cr, Al, Nb, Hf and W metals and metallic compounds.

12. The vacuum coated compound body of claim 10, wherein the $Al_2O_3$ layer has a thickness in the range of 1 to 20 μm.

13. The vacuum coated compound body of claim 12, wherein the $Al_2O_3$ layer has a thickness of approximately 3 μm.

14. The vacuum coated compound body of claim 8, wherein the $Al_2O_3$ layer has a thickness in the range of 1 to 20 μm.

15. The vacuum coated compound body of claim 14, wherein the $Al_2O_3$ layer has a thickness of approximately 3 μm.

16. A process for the production of a vacuum coated compound body comprising a carrier of a material selected from the group consisting of a metal and an alloy, and further comprising an outer layer comprising $Al_2O_3$, the process comprising:

applying an outer layer of $Al_2O_3$, via reactive magnetron sputtering in a vacuum and at a temperature of not more than 700° C., to an element comprising a carrier selected from the group consisting of a metal and an alloy, the reactive magnetron sputtering comprising:

depositing the $Al_2O_3$ layer via pulsed magnetron sputtering via a delivery of oxygen-containing gas;

setting the pulse frequency for 20 to 100 kHz for achieving a deposition at a deposition rate of at least 1 nm/s with reference to a stationarily arranged carrier; and alternating a pulse-shaped current, from a positive to a negative charge carrier, with the carrier having a medium current density of at least 1 $mA/cm^2$ and a pulse frequency of at least 5 kHz, occurring at the carrier;

wherein the $Al_2O_3$ layer is in totally crystalline form at a maximum temperature of 700° C., and is comprised of at least an $\alpha$-$Al_2O_3$-phase, and wherein the $Al_2O_3$ layer has a residual compressive stress of at least 1 GPa and a hardness of at least 20 GPa, and is essentially free of impurities other than argon.

17. The process of claim 16, wherein the element further comprises at least one intermediate layer coating the carrier, the at least one intermediate layer comprising at least one member selected from the group consisting of Ti, Zr, Cr, Al, Nb, Hf and W metals and metallic compounds.

18. The process of claim 17, further including applying the at least one intermediate layer via vacuum coating.

19. The process of claim 18, further including accomplishing the vacuum coating via magnetron sputtering.

20. The process of claim 17, wherein the pulse frequency is approximately 50 kHz.

21. The process of claim 17, wherein the deposition of the $Al_2O_3$ layer is accomplished via the sputtering of two commonly acting Al targets; and alternately switching the targets as a cathode and as an anode of a magnetron sputtering apparatus.

22. The process of claim 21, wherein the element further comprises at least one intermediate layer coating the carrier, the at least one intermediate layer comprising at least one member selected from the group consisting of Ti, Zr, Cr, Al, Nb, Hf and W metals and metallic compounds.

23. The process of claim 22, further including applying the at least one intermediate layer via vacuum coating.

24. The process of claim 23, further including accomplishing the vacuum coating via magnetron sputtering.

25. The process of claim 16, wherein the deposition of the $Al_2O_3$ layer is accomplished via the sputtering of an Al target of a magnetron sputtering apparatus.

26. The process of claim 25, wherein the element further comprises at least one intermediate layer coating the carrier, the at least one intermediate layer comprising at least one member selected from the group consisting of Ti, Zr, Cr, Al, Nb, Hf and W metals and metallic compounds.

27. The process of claim 26, further including applying the at least one intermediate layer via vacuum coating.

28. The process of claim 27, further including accomplishing the vacuum coating via magnetron sputtering.

* * * * *